(12) United States Patent
Sheehan et al.

(10) Patent No.: US 7,541,062 B2
(45) Date of Patent: Jun. 2, 2009

(54) THERMAL CONTROL OF DEPOSITION IN DIP PEN NANOLITHOGRAPHY

(75) Inventors: Paul E. Sheehan, Springfield, VA (US); Lloyd J. Whitman, Alexandria, VA (US); William P. King, Atlanta, GA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 825 days.

(21) Appl. No.: 10/956,596

(22) Filed: Sep. 29, 2004

(65) Prior Publication Data

US 2006/0040057 A1 Feb. 23, 2006

Related U.S. Application Data

(60) Provisional application No. 60/603,518, filed on Aug. 18, 2004.

(51) Int. Cl.
*B05D 7/00* (2006.01)
*B05D 1/26* (2006.01)

(52) U.S. Cl. ............ 427/256; 427/294; 427/314; 977/849; 977/851; 977/855; 977/857

(58) Field of Classification Search ............ None
See application file for complete search history.

(56) References Cited

U.S. PATENT DOCUMENTS 4,343,993 A * 8/1982 Binnig et al. ............ 250/306
4,954,704 A * 9/1990 Elings et al. ............ 250/307
5,043,578 A * 8/1991 Guthner et al. ............ 250/307
5,371,365 A * 12/1994 Watanabe et al. ............ 250/306
6,635,311 B1 10/2003 Mirkin et al.

(Continued)

FOREIGN PATENT DOCUMENTS

WO 2004044552 5/2004

OTHER PUBLICATIONS

Schwartz et al, "Molecular Transport From an Atomic Force Microscope Tip: A Comparative Study of Dip-Pen Nanolithography", American Chemical Society, vol. 18, pp. 4041-4046, 2002.

(Continued)

*Primary Examiner*—William Phillip Fletcher, III
(74) *Attorney, Agent, or Firm*—John J. Karasek; Joseph T. Grunkemeyer

(57) ABSTRACT

The present invention describes an apparatus for nanolithography and a process for thermally controlling the deposition of a solid organic "ink" from the tip of an atomic force microscope to a substrate. The invention may be used to turn deposition of the ink to the substrate on or off by either raising its temperature above or lowing its temperature below the ink's melting temperature. This process may be useful as it allows ink deposition to be turned on and off and the deposition rate to change without the tip breaking contact with the substrate. The same tip can then be used for imaging purposes without fear of contamination. This invention can allow ink to be deposited in a vacuum enclosure, and can also allow for greater spatial resolution as the inks used have lower surface mobilities once cooled than those used in other nanolithography methods.

17 Claims, 7 Drawing Sheets

U.S. PATENT DOCUMENTS

| | | | |
|---|---|---|---|
| 6,642,129 B2 * | 11/2003 | Liu et al. | 438/496 |
| 6,674,074 B2 | 1/2004 | Schwartz | |
| 2002/0122873 A1 | 9/2002 | Mirkin et al. | |

OTHER PUBLICATIONS

Nelson et al, "Transport In Thermal Dip Pen Nanolithography", Proceedings of NANO04, pp. 1-2, 2004.

Vettiger et al, "The "Millipede"—Nanotechnology Entering Data Storage", Transaction On Nanotechnology, vol. 1, No. 1, pp. 39-55, Mar. 2002.

King et al, "Design of Atomic Force Microscope Cantilevers For Combined Thermomechanical Writing and Thermal Reading in Array Operation", Journal of Microelectromechanical Systems, vol. 11, No. 6, pp. 765-774, Dec. 2002.

King et al, "Atomic Force Microscope Cantilevers For Combined Thermomechanical Data Writing and Reading", Applied Physics Letters, vol. 78, No. 9, pp. 1300-1302, Feb. 26, 2001.

PCT search report and written opinion for PCT/US05/15966, Oct. 4, 2006.

EPO search report and communication for EP 05 77 1292, Jan. 24, 2008.

Lee et al., "Switchable cantilever for a time-of-flight scanning force microscope" Appl. Phys. Lett., 84, 1558-1560 (2004).

Highinuma et al., "Measurements of cooling by room-temperature thermionic emission across a nanometer gap" J. Appl. Phys., 94, 4690-4696 (2003).

Neves et al., "Self-healing on OPA self-assembled monolayers" Nanotechnology, 12, 285-289 (2001).

Wachter et al., "Remote optical detection using microcantilevers" Rev. Sci. Instrum., 67, 3434-3439 (1996).

* cited by examiner

THERMAL CONTROL OF DEPOSITION IN DIP PEN NANOLITHOGRAPHY

This application claims the benefit of U.S. Provisional Application No. 60/603,518, filed on Aug. 18, 2004.

BACKGROUND OF THE INVENTION

1. Field of the Invention

This invention relates to an apparatus and method for thermally controlling deposition in Dip-Pen Nanolithography, or DPN (Dip-Pen Nanolithography, and DPN are registered trademarks of Nanoink).

2. Description of the Prior Art

The ability to create ever smaller structures and patterns is the key to producing smaller and faster electronics. Some of the newest technologies allow the creation of structures on the nanometer, or $10^{-9}$ meter, scale. One of these technologies is DPN, which is described in U.S. Pat. No. 6,635,311 and is incorporated herein by reference (all patent and publication references included in this specification hereinafter are also incorporated by reference). DPN is a method for depositing molecules onto a surface with the tip of an atomic force microscope (AFM). The method is very much like dipping a pen into an inkwell and then using it to write except DPN is on a much smaller scale. In DPN, the AFM tip, or "pen," is dipped or coated with the desired molecule or "ink" and then brought into contact with the surface, onto which the molecules diffuse. Lines or patterns can be created by moving the tip over the surface in much the same way one would move a pen over paper.

With this technology, however come some limitations. When writing with a pen on paper one must lift the pen to stop writing. The same is true for DPN; to stop deposition the AFM tip must break contact with the surface. Unfortunately, this can often lead to a loss of registry between the tip and the surface. Another drawback to DPN is that a coated tip cannot be used for imaging purposes while in contact mode without causing contamination—deposition of unwanted ink. Therefore, a need exists for a device that can turn deposition on or off while the tip maintains contact with the surface.

DPN is further limited in that besides changing the ink, the tip, or the tip's speed, there is little control over the deposition rate once a molecule has been coated onto the tip. The typical ink molecules utilized in DPN have to be sufficiently mobile to transfer from the AFM tip to the surface under ambient conditions. This ambient temperature mobility requirement limits the types of inks that may be used in DPN and results in "bleeding" or spreading out of the ink once it is deposited onto a surface, which in turn limits the precision of structures that can be created with DPN. Because of this necessary volatility of the inks used in DPN, the process cannot be performed in a vacuum; the ink would evaporate too quickly and contaminate the system. The need exists for a better method that may be performed in a vacuum and that allows for the use of a greater variety of inks. A better method is also needed to control the rate of deposition and to limit the excess diffusion of molecules over the surface after deposition.

Information relevant to attempts to address these problems can be found in U.S. Pat. Nos. 6,737,646 and 6,642,129. However, each one of these references suffers from one or more of the following disadvantages: inability to image in contact mode without contaminating, inability to turn deposition on or off, and inability to control excess diffusion of ink once deposited. For the foregoing reasons, there is a need for a process of turning ink deposition on and off in DPN without breaking contact between the tip and the surface. Likewise, there is a need for an apparatus that can control the ink deposition rate and limit the amount of excess ink diffusion or contamination over the surface.

SUMMARY OF THE INVENTION

This invention is directed to a thermal control apparatus, a deposition control method, and a multiple patterning compounds deposition method. A thermal control apparatus that has features of this invention comprises a temperature control device that is operatively connected to a scanning probe microscope tip. The tip is capable of being coated with at least one patterning compound, or ink, and the temperature control device alters the temperature of the patterning compound more than the average temperature of the environment of the tip.

Another aspect of this invention provides a deposition control method comprising providing a surface or substrate and a scanning probe microscope tip coated with at least one patterning compound. When the patterning compound is in contact with the substrate, the temperature of the patterning compound is altered so that it becomes mobile or immobile. In its mobile phase, the compound can be deposited to the substrate in a desired pattern. The temperature of the patterning compound is altered more than the average temperature of the environment of the tip.

Another aspect of the present invention provides a method for depositing multiple patterning compounds. The method comprises providing a substrate and a scanning probe microscope tip coated with at least two patterning compounds in order of their different melting temperatures, e.g. coating the tip with the compound with the highest melting temperature first. The temperature of the patterning compounds may be altered to allow only those patterning compounds whose immobile-to-mobile temperatures have been reached or exceeded to be deposited onto a substrate in contact with the patterning compound.

BRIEF DESCRIPTION OF THE DRAWINGS

A more complete appreciation of the invention will be readily obtained by reference to the following Description of the Example Embodiments and the accompanying drawings.

DETAILED DESCRIPTION OF THE EXAMPLE EMBODIMENTS

Figure 1:
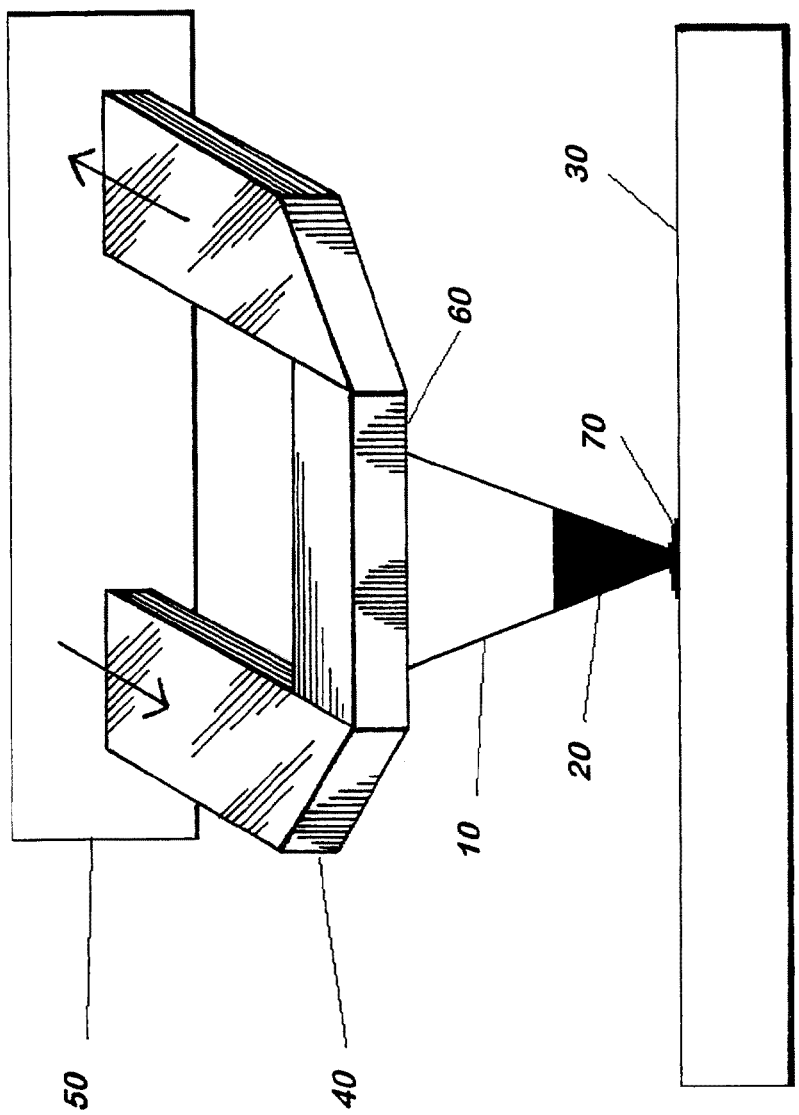
FIG. 1 schematically illustrates an apparatus of the invention.

Although it has been widely assumed that DPN requires a water meniscus to transfer ink from an AFM tip to a surface, it has been shown that transfer can occur under xeric conditions, a method called "dry deposition." Recent studies of dry deposition have led to a number of insights into how DPN can be extended beyond "wet" inks. For example, deposition should be possible at high temperatures (i.e., above the boiling point of water) and, thus, temperature could be used to control deposition.

Thermal DPN (tDPN) enhances traditional DPN in many ways. First, it can allow exquisite control over writing. Deposition may be turned on or off and the deposition rate changed without breaking contact with the surface. Secondly, the inks used have can have lower surface mobilities once cooled and so are able to achieve higher spatial resolution. Thirdly, imaging with a cool tip may not contaminate the surface. This allows in situ confirmation of the deposited pattern without fear of contamination. Finally, tDPN expands the range of useable inks.

This method may utilize patterning compounds with high melting temperatures. Patterning compounds with high melting temperatures generally have low vapor pressures and diffuse more slowly than compounds with low melting temperatures. This characteristic helps limit the amount of bleeding and makes it possible to perform the method in a vacuum enclosure.

The present invention is primarily directed to thermally controlling the deposition onto a substrate of a patterning compound, coated onto a scanning probe microscope tip. Thermal control allows for deposition independent of time and for deposition to be stopped. This invention may utilize scanning probe microscope tips used in atomic scale imaging such as atomic force microscope (AFM) tips, near field scanning optical microscope tips, scanning tunneling microscope tips, and any other similar devices with a tip that is capable of being coated with a patterning compound and is controllable in three dimensions with respect to a substrate. The invention also has a means for altering the temperature of the patterning compound on the tip sufficiently to allow the patterning compound to transition from immobile to mobile. Once mobile, the patterning compound is free to transfer from the tip to the contact area with the substrate. In its immobile phase, no compound is deposited. The exact order of the steps taken in this method is not critical, as long as they result in a deposit of patterning compound on the substrate. For example, the patterning compound may be contacted to the substrate before or after altering its temperature. A desired pattern may be created by moving the substrate with respect to the tip. A single tip may be used in tDPN or a plurality of parallel tips, each coated with a desired patterning compound may be used. If multiple tips are used, one or more tips may be coated with different patterning compounds.

The temperature of the patterning compound is altered more than the temperature of the environment. This can create sharp patterns or features on the nanometer scale. The "environment" of the tip refers to the greater volume of gases or liquid around the tip, but not merely the immediately adjacent gases or liquid. For example, if the tip is in a closed, gas-filled chamber, the environment refers to the entire bulk of the gas in the chamber. If the tip is exposed to the atmosphere, the environment refers to the ambient air. When the tip is in a vacuum, there is considered to be no change to the average temperature of the environment. The temperature of the patterning compound is altered more than that of the environment to allow for fast cooling of the patterning compound to stop the writing.

By changing the temperature of the ink on the tip this version of the present invention can be used to start or stop ink deposition without the tip having to break contact with the surface. One example embodiment of tDPN utilizes patterning compounds with high melting temperatures, above 25° C., which generally diffuse more slowly than compounds with low melting temperatures, equal to or less than 25° C.

Low surface diffusivity limits the spread or "bleeding" over the substrate. The lower the diffusivity, the tighter the pattern created with tDPN. In basic Dip-Pen Nanolithography, without thermal control, low surface diffusivity is undesirable since it also means lower diffusivity on the tip as well, preventing the patterning compound from flowing. In tDPN, diffusivity on the tip is controlled by heating the patterning compound, such that good flow is obtained with no bleeding. If the bulk of the air were heated to heat the patterning compound on the tip, the air would also heat the substrate, which may cause the patterning compound to bleed over the substrate. Thus the temperature of the patterning compound may be altered more than that of the substrate. Heating the bulk of the air may also cause slower cooling of the ink on the tip, resulting in slow turn-off of writing.

However, if greater surface mobility of the patterning compound over the substrate is desired, the following example allows for that. This example of an embodiment of tDPN provides for heating or cooling the substrate as a means of controlling the temperature, and therefore, the deposition of the patterning compound when the tip is in contact with the substrate.

Scanning probe microscope tips are commonly formed on a distal end of a cantilever. The patterning compound may be heated when it is on the cantilever tip, the cantilever beam or both. When the patterning compound is heated to or above its melting temperature ($T_m$), the melted patterning compound is free to flow onto the substrate. This method not only allows the deposition of molecules that are not mobile at room temperature, or about 25° C., but also allows control of the rate at which they are deposited. The greater the temperature above $T_m$, the greater is the deposition rate. When the patterning compound is not heated or heated to a temperature less than $T_m$, no deposition may occur.

One embodiment of tDPN is the use of AFM cantilevers with integrated resistive heaters to deposit an ink that is solid at 25° C. The cantilever may be made of many materials such as plastic, metal, ceramic, or a combination of the above. If the resistive heating occurs away from the tip, that cantilever may be designed to provide that enough heat flows into the patterning compound on the tip to allow for deposition. The cantilever tip may be heated at a constant heating power, or at a time-varying heating power, or in short pulses of heating power. Desired changes in the heating and cooling constants of the cantilever tip may be altered by changing the design of the cantilever. One version of the tDPN apparatus utilizes a silicon AFM cantilever produced for thermomechanical data storage by the IBM Zurich Research Lab. This cantilever was fabricated with a standard silicon-on-oxide cantilever fabrication process, and has a tip on its distal end with a radius of curvature of about 100 nanometers. The cantilever has a heating time of about 1 to 20 microseconds and a cooling time in the range of 1 to 50 microseconds. The cantilever can approach 700° C. in short pulses and, because the resistive heating element is also a temperature sensor, calibration of the cantilever temperature response is possible to 1° C.

FIG. 1 schematically illustrates the apparatus of the invention. Tip 10 contains a coating 20, and is placed in contact with a substrate 30. In this embodiment, the tip 10 is formed on a cantilever 40. The drawing is not to scale, and the tip is actually much smaller relative to the cantilever than depicted. A heating element 50 is attached to the cantilever 40 for heating the tip 10, by way of a resistive element 60. The arrows indicate current passing through the cantilever 40 and tip 10, heating the tip 10, and causing deposition 70 of patterning compound on the substrate.

Figure 2:
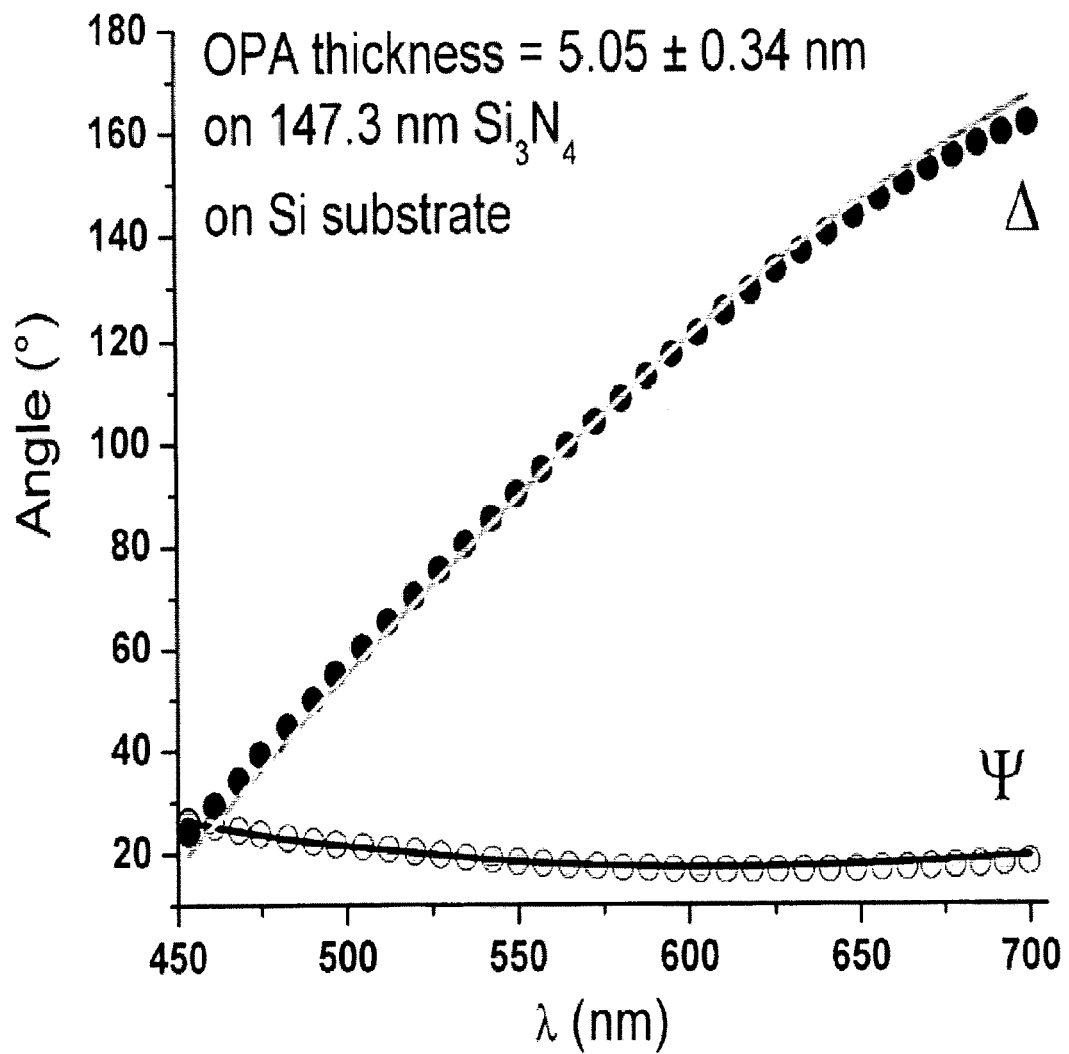
FIG. 2 shows ellipsometry data regarding the deposition of OPA onto an AFM tip.

The cantilever can be coated with octadecylphosphonic acid (OPA), which is a versatile molecule that self-assembles into monolayers on mica, metals such as stainless steel and aluminum, and metal oxides such as $TiO_2$ and $Al_2O_3$. OPA's $T_m$ of about 99° C. is well suited for tDPN as its $T_m$ is well above 25° C. and within the thermal range of the integrated resistive heater. One way to coat OPA to the tip is by evaporation. This may be accomplished by first heating a scintillation vial containing about 60 mg of OPA on a hot plate set at 110° C. The cap of the scintillation vial may then be replaced for about 30 minutes with a tip holder maintained at about 35° C. From the ellipsometry data shown in FIG. 2, it is known that this procedure deposits the mass equivalent of two complete monolayers of OPA onto the tip.

Another suitable patterning compound is indium, which could be used for nanoscale soldering. The method could also pattern functional organic molecules, allowing for direct write manufacturing. The deposited compound can form a template to direct or nucleate the growth of nanostructures.

Many different patterning compounds that melt before degrading such as polymers, inorganic polymers, low $T_m$ metal eutectics, or organic molecules may be used in tDPN. Although the dependence on $T_m$ has been noted above, any molecule that undergoes a transition from immobile to mobile as a function of temperature may be used. For instance, a transition from a solid to a liquid or liquid crystal may be sufficient for deposition, or from highly viscous liquid or glass to less viscous liquid. The substrate may be of any size, shape, or material that may be modified by a patterning compound to provide a stable surface structure. One example embodiment of tDPN utilizes freshly-cleaved mica as a substrate.

Besides integrated resistive heaters, any means that can sufficiently alter the temperature of the patterning compound on the tip to allow the compound to transition from immobile to mobile may be used for tDPN. One example is commercially available or custom fabricated piezoresistive cantilevers, which have an internal electrically resistive element that will heat if biased at a sufficiently high voltage. Another example would be a remote electromagnetic energy source that could be attuned to an absorption band of the patterning compound, the tip onto which the compound is coated, or an absorber, which could transfer the electromagnetic energy it receives into the patterning compound on the tip. An absorber in the example above could be a micro-fabricated antenna on the cantilever, or any an absorbent material integrated into the tip or cantilever. Also, used in conjunction with patterning compounds with melting temperatures equal to or below 25° C., cooling elements may be used to alter the temperature of the patterning compound. The cooling element would keep the patterning compound frozen or immobile until deposition onto the substrate is desired. Such cooling elements could be a thermionic cooler or utilize the Peltier effect. These cooling elements may be integrated directly into the cantilever to provide for deposition of patterning compounds that would be too volatile to deposit with basic DPN. Using a cooling element, a volatile patterning compound may be immobilized on the tip until deposition is desired. Once the temperature of the patterning compound reaches or exceeds its $T_m$, deposition occurs and reaction with the substrate prevents subsequent evaporation of the patterning compound.

An example embodiment of tDPN may be utilized to create three-dimensional structures. Because tDPN allows a patterning compound's fluidity to be enhanced mostly on the cantilever and tip, a patterning compound may be used that solidifies upon contact with the substrate. Thus, structures could be built up slowly to a desired thickness either by scanning and depositing several times over the same area or by holding the tip stationary in the plane of the sample and slowly raising it as patterning compound is deposited.

Another example embodiment of tDPN provides for depositing a patterning compound in a vacuum enclosure. Because of the necessary volatility of the patterning compounds used in basic DPN, it is not possible to place the coated cantilever in ultra-high vacuum (UHV). The patterning compound would evaporate too quickly and would contaminate the system. An embodiment of tDPN obviates this problem by allowing the use of high $T_m$ patterning compounds, which consequently have low vapor pressures. The lower vapor pressure means that the patterning compound will remain on the tip long enough to be patterned onto the surface. The temperature ramping of the patterning compound to control deposition may therefore be used in a vacuum enclosure. Additionally, due to the broad range of patterning compounds that may be used in tDPN, it is also possible to perform tDPN in a liquid-filled or gas-filled enclosure.

Another example embodiment of tDPN allows for the deposition of multiple patterning compounds from the same tip. For instance, if three patterning compounds (A, B, & C) were coated onto the tip in order of their melting temperatures with C forming the first coat on the tip and $T_m(A)<T_m(B)<T_m(C)$, then just A may be deposited by keeping the working temperature below $T_m(B)$. Similarly, just patterning compounds A and B may be deposited at working temperatures less that $T_m(C)$. All three may be deposited at temperatures above $T_m(C)$. The patterning compounds must be chosen carefully to avoid solvation effects that could lower their melting temperatures and facilitate co-deposition. This same embodiment could be used with an array of tips, where one or more of the tips in the array could be coated with several different patterning compounds.

The development of tDPN opens several opportunities for DPN-based nanofabrication. Large arrays of heater cantilevers may be fabricated that can write more than $10^6$ pixels/s, and thus reasonable write times could be achieved over wafer-scale areas. Thermal control should allow deposition of a wide variety of solid inks that were previously inaccessible to DPN. For instance, metals of appropriate melting temperatures could be patterned with this technique, creating a nanometer scale "soldering iron." Finally because the molecules in tDPN can be solid at 25° C., it should be possible to build up multilayer multi-component patterns to create true three-dimensional nanostructures.

Having described the invention, the following examples are given to illustrate specific applications of the invention. These specific examples are not intended to limit the scope of the invention described in this application.

EXAMPLE 1

Figure 3:
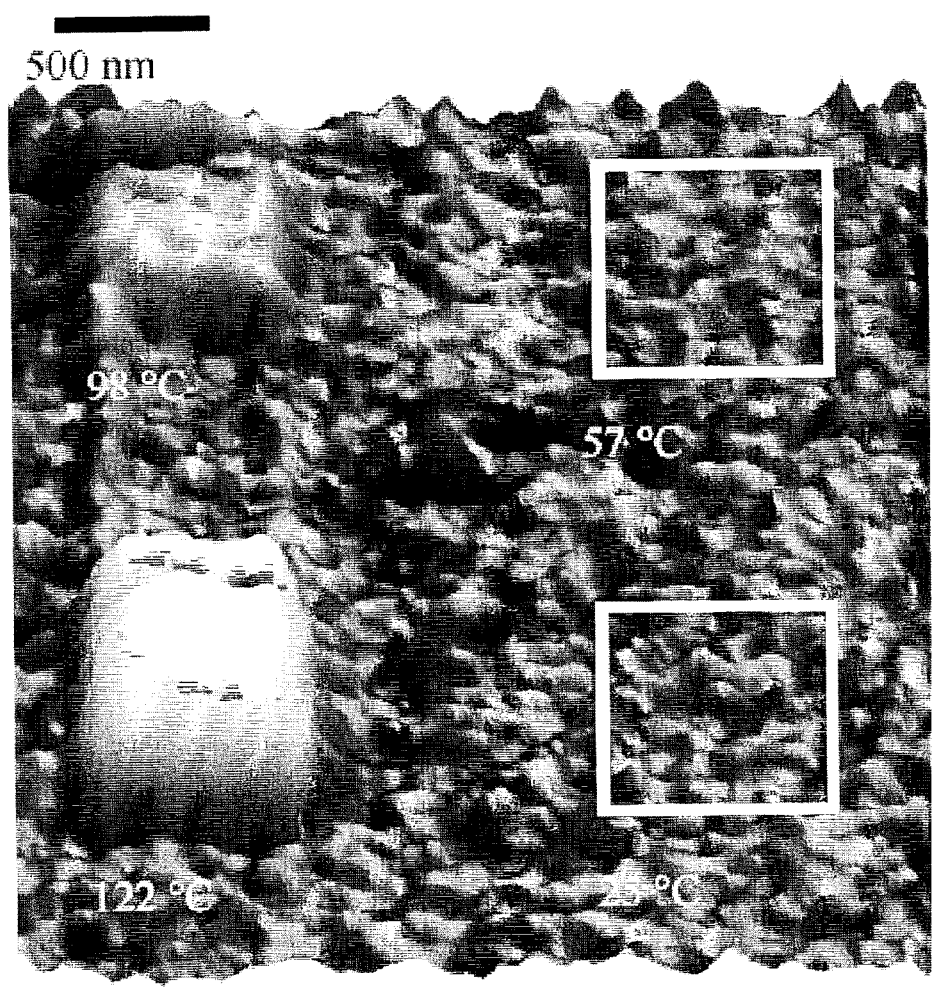
FIG. 3 shows a micrograph of OPA written onto mica using tDPN at different temperatures.
Figure 4:
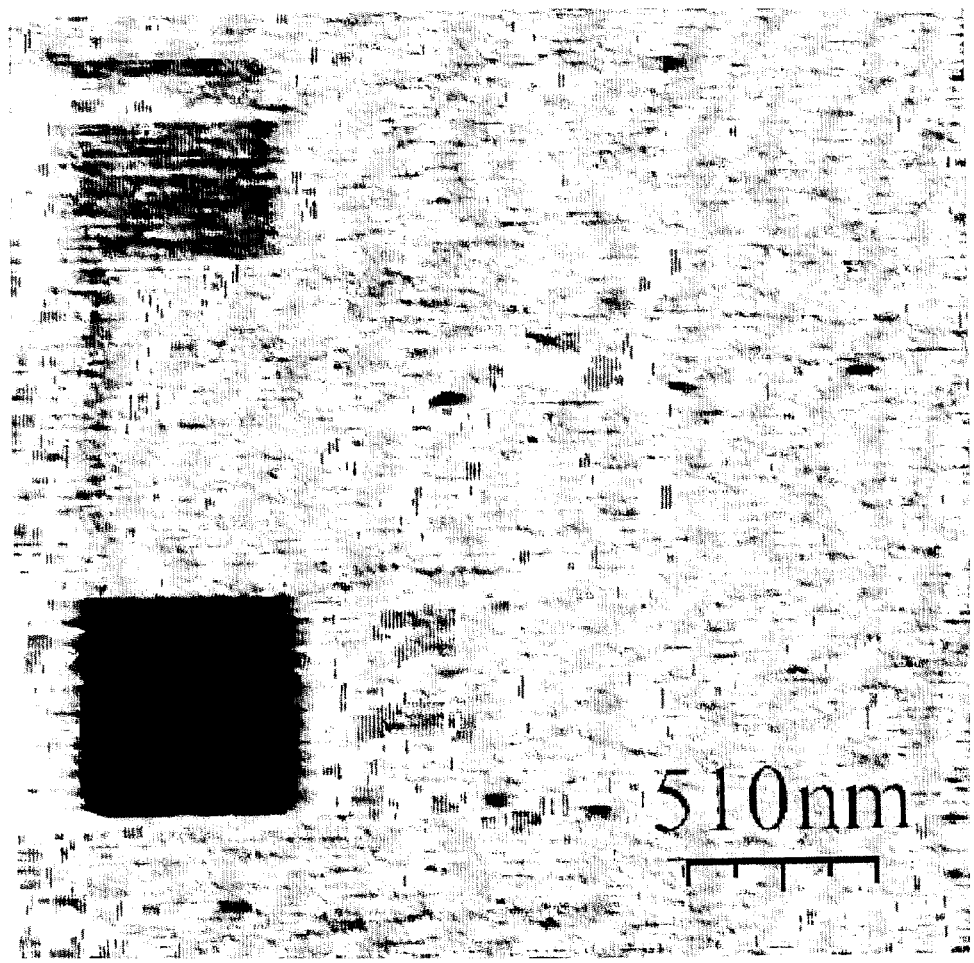
FIG. 4 shows a friction image of the sample shown in FIG. 3.

Deposition of OPA — An AFM tip, coated with OPA in the manner described above, was rastered over four, 500 nanometer square regions on a mica substrate at 2 Hz and 128 lines per scan, or for a total scan time of 256 s. For each square, the temperature of the cantilever was increased, finally exceeding OPA's melting temperature. When the temperature of the tip was held below OPA's $T_m$, either at 25° C. or at 57° C., no patterned squares were observed. Raising the tip temperature to 98° C., near OPA's $T_m$, resulted in light deposition. The average height of this area was 1.1 nm, which is slightly less than one-half the height of a full monolayer. Robust deposition was finally seen when the cantilever temperature was raised to 122° C., creating a square pattern with a height of 2.5 nm, indicative of a full monolayer, as shown in FIG. 3. The corresponding friction image, shown in FIG. 4, confirms OPA deposition. The binding of OPA to mica exposes a methyl terminal group, which would reduce friction relative to the bare mica surface. No change in friction was observed for the lower cantilever temperatures. The light deposition at 98° C. reduced friction slightly, as expected, and the full monolayer deposited at 122° C. reduced friction much further.

Figure 5:
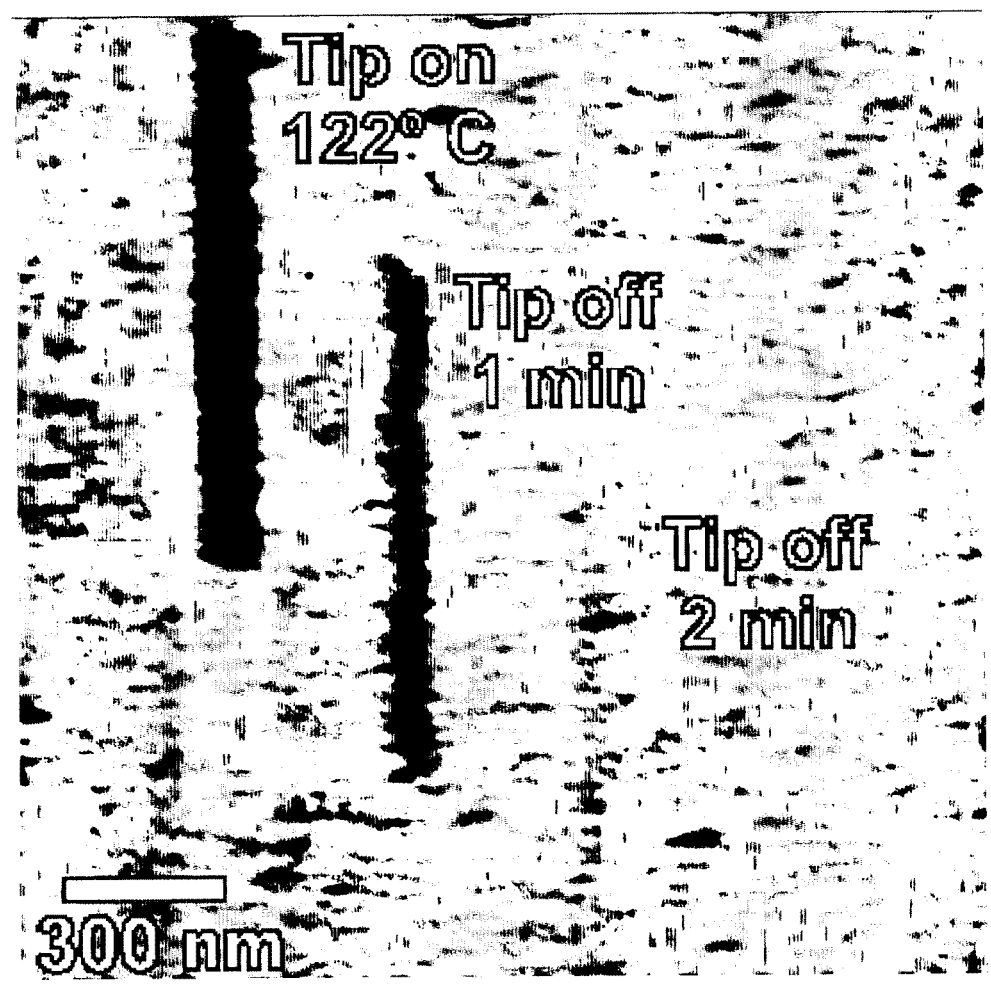
FIG. 5 shows three lines written by tDPN, two of which were made after the heating was turned off.
Figure 6:
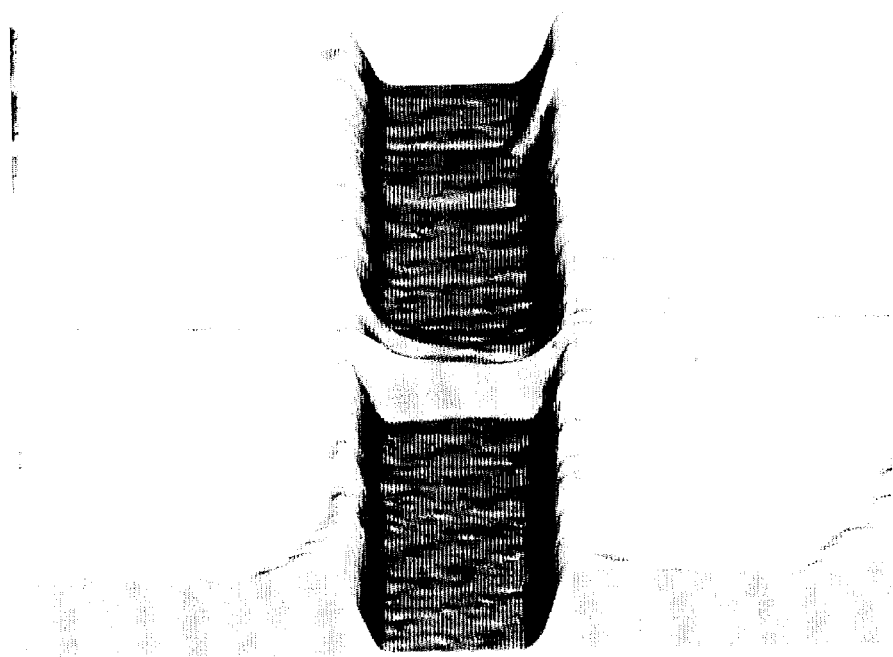
FIG. 6 shows a micrograph of a line of PDDT written by tDPN.

Although deposition started instantaneously upon heating, deposition continued for a time after the heating current was stopped. FIG. 5 shows three lines written via tDPN where the tip sequentially traced three vertical lines for 1 min apiece. The cantilever was heated only for the first, upper left, line. Thus, deposition continued for roughly 2 minutes after the cantilever heating was stopped. Modification of ultra-thin polymer layers on a silicon surface for data storage applications has been shown to be highly localized near the tip and fully complete in the range of 1-10 microseconds. (King et al., Design of Atomic Force Microscope Cantilevers for Combined Thermomechanical Writing and Thermal Reading in Array Operation, Journal of Microelectromechanical Systems, Vol. 11, No. 6, 2002) The present system differs from the system presented in King et al. in that the tip is coated with the patterning compound and in that the mica substrate has a much lower thermal conductivity than Si. The present experiments do not indicate whether the ink remains hot on the tip or whether the substrate is significantly heated by the tip; although, a simple scaling of the cooling time constants yields ~10 microseconds for the cantilever, ~100 nanoseconds for the tip, ~10 nanoseconds for the ink, and ~10 nanoseconds for the heated region of the substrate. Thus, it is likely that residual heat in the substrate prolonged the writing and that deposition would cease quickly on substrates with greater thermal conductivity, such as Si or a metal. Careful selection of the substrate material and engineering of the write speeds could reduce the tDPN write time into the 100 kHz range demonstrated in the data storage application.

Two features of FIG. 5 reveal the potential for significantly improving this lithography method. First, the line-width (full width at half maximum of cross section) in this non-optimized system is only 98 nanometers across, which is comparable to the radius of curvature of the tip used, ~100 nanometers (from a SEM). Heated cantilevers with tips sharper than 20 nanometers may be fabricated, which can make marks in a polymer as small as 23 nm. Advances in tip construction should therefore allow a decrease in line-width by an order of magnitude. Second, although the ink is presumably cooler with each subsequent line, there is no appreciable change in line-width. The independence of line-width on temperature suggests that the width is mainly determined by the sharpness of the tip, not diffusion of the OPA molecules following deposition. This aspect of tDPN is in contrast to conventional DPN, where increasing the global temperature increases both the deposition rate and the subsequent spreading of the pattern caused by surface diffusion. Global heating thereby leads to larger patterns presumably having larger halos of contamination. Thus, local control over heating will allow fast deposition rates and sharp features. Careful engineering of the cantilever, tip, and substrate should allow tDPN to write features as small as 10 nanometers. In the present invention, none of the hallmarks of contamination were observed, such as halos around deposited features or "fill-in" patterns following repeated imaging with coated tips.

EXAMPLE 2

Deposition of PDDT — tDPN was used to deposit conducting polymer between electrodes. The polymer was poly (3-dodecylthiophene) (PDDT), a semiconducting polymer useful for organic FETs. The tip was heated to ~200° C. under nitrogen (to avoid oxidation). The tip was then scanned from one electrode to the other for 2 minutes. The deposited line was 20 nm thick and 150 nm wide and spaned an 800 nm wide gap.

EXAMPLE 3

Figure 7:
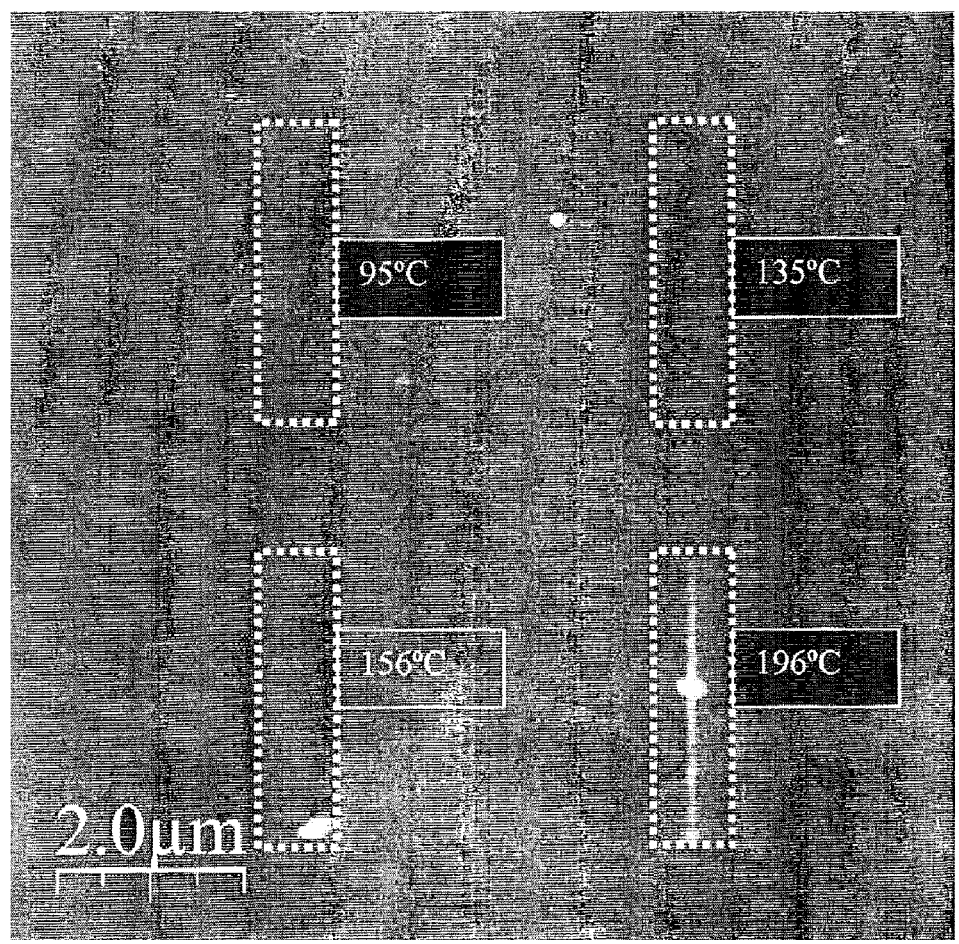
FIG. 7 shows a micrograph of lines of indium written by tDPN

Deposition of Indium — For the repair of nanoscale circuits or of the photomasks used to make modern circuitry, it is important to be able to write small, conducting wires. tDPN was used to pattern indium, a low melting point metal and a common solder. FIG. 7 shows a series of 3 µm lines written at a tip speed of 3 µm/s. Each line was traversed 64 times (i.e., 32 trace/retraces) by the depositing tip. The top two lines written at 95° C. and 135° C. do not show, the faint line at bottom left was written at 156° C. which is close to the melting temperature of the indium, 156.6° C. The line at bottom right was written at 196° C., which is well above the melting temperature of indium, and demonstrates robust deposition at this temperature.

Obviously, many modifications and variations of the present invention are possible in light of the above teachings. It is therefore to be understood that the claimed invention may be practiced otherwise than as specifically described.

What is claimed is:

1. A deposition control method comprising the acts of:
providing a substrate;
providing a scanning probe microscope tip coated with at least one patterning compound;
contacting the patterning compound-coated tip with the substrate;
altering the temperature of the patterning compound so as to allow the patterning compound to transition between immobile and mobile;
wherein the temperature of the patterning compound is altered more than the average temperature of the environment of the tip; and
allowing a desired amount of the mobile patterning compound to transfer to the substrate in a desired pattern while the patterning compound-coated tip is in contact with the substrate.

2. The method as in claim 1, wherein the substrate is mica, and the patterning compound is octadecylphosphonic acid.

3. The method as in claim 1, wherein the patterning compound is 10-undecenyl tricholorosilane.

4. The method of claim 1, wherein acts of contacting the patterning compound with the substrate, altering the temperature of the patterning compound, and allowing a desired amount of patterning compound to transfer to the substrate are performed in a vacuum enclosure.

5. The method of claim 1, wherein acts of contacting the patterning compound with the substrate, altering the temperature of the patterning compound, and allowing a desired amount of patterning compound to transfer to the substrate are performed in liquid filled enclosure.

6. The method of claim 1, wherein acts of contacting the patterning compound with the substrate, altering the temperature of the patterning compound, and allowing a desired amount of patterning compound to transfer to the substrate are performed in a gas filled enclosure.

7. The method of claim 1, wherein the patterning compound has a melting temperature above about 25° C.

8. The method of claim 1, wherein the patterning compound has a melting temperature less than or equal to about 25° C.

9. The method of claim 1, wherein the act of altering the temperature of the patterning compound comprises altering the temperature of the substrate while it is in contact with the patterning compound.

10. The method of claim 1, wherein the act of altering the temperature of the patterning compound comprises the use of an element selected from the group consisting of a piezoresistive element, a resistive element, an electromagnetic energy source, and a cooling element.

11. The method of claim 1, further comprising the act of allowing the patterning compound to build up on the substrate to a desired thickness.

12. The method of claim 11, wherein the act of allowing the patterning compound to build up on the substrate to a desired thickness is done by repeatedly scanning the same area of the substrate.

13. The method of claim 11, wherein the act of allowing the patterning compound to build up on the substrate to a desired thickness is done by holding the tip stationary in the plane of the substrate while increasing the distance between the tip and the substrate as the patterning compound is being deposited.

14. The method of claim 1, wherein the act of providing a scanning probe microscope tip comprises providing a plurality of tips coated with the patterning compound.

15. The method of claim 1, wherein the act of providing a scanning probe microscope tip comprises providing a plurality of tips, where at least one tip is coated with a different patterning compound.

16. A method for depositing multiple patterning compounds comprising the acts of:

providing a substrate;

providing a scanning probe microscope tip coated with at least two patterning compounds having different melting temperatures, the patterning compounds forming coatings in order of their melting temperatures with the patterning compound having the highest melting temperature forming the first coating;

contacting the patterning compound with the substrate;

altering the temperature of the patterning compounds so as to allow at least one of the patterning compounds to transition between immobile and mobile; and allowing a desired amount of the mobile patterning compound to transfer to the substrate in a desired pattern;

wherein only those patterning compounds whose transition temperatures are reached or exceeded are deposited.

17. The method of claim 16, wherein the act of providing a scanning probe microscope tip comprises providing a plurality of tips coated with at least two desired patterning compounds.

* * * * *